(12) United States Patent
Li et al.

(10) Patent No.: US 7,414,481 B2
(45) Date of Patent: Aug. 19, 2008

(54) RECEIVER WITH COLPITTS DIFFERENTIAL OSCILLATOR, COLPITTS QUADRATURE OSCILLATOR, AND COMMON-GATE LOW NOISE AMPLIFIER

(75) Inventors: Xiaoyong Li, San Diego, CA (US); David J. Allstot, Seattle, WA (US)

(73) Assignee: University of Washington, Seattle, WA (US)

( * ) Notice: Subject to any disclaimer, the term of this patent is extended or adjusted under 35 U.S.C. 154(b) by 59 days.

(21) Appl. No.: 11/344,549

(22) Filed: Jan. 30, 2006

(65) Prior Publication Data
US 2007/0176703 A1 Aug. 2, 2007

(51) Int. Cl.
H03F 1/22 (2006.01)
H03F 3/45 (2006.01)
H03F 1/00 (2006.01)

(52) U.S. Cl. .................. 330/311; 330/165; 330/253
(58) Field of Classification Search ............... 330/165, 330/195, 253, 277, 301, 311
See application file for complete search history.

(56) References Cited

U.S. PATENT DOCUMENTS 5,450,038 A * 9/1995 Rydel .................... 330/310
6,271,721 B1 * 8/2001 Trask .................... 330/98

OTHER PUBLICATIONS

Rofougaran, A. et al., "A 900MHz CMOS LC-Oscillator with Quadrature Outputs," 1996 IEEE International Solid-State Circuits Conference, pp. 392-393.

Shaeffer, D.K. et al., "A 1.5-V 1.5-GHz CMOS Low-Noise Amplifier," IEEE J. of Solid-State Circuits, vol. 32, No. 5, pp. 745-759, May 1997.

Hajimiri, A. et al., "A General Theory of Phase Noise in Electrical Oscillators," IEEE J. of Solid-State Circuits, vol. 33, No. 2, pp. 179-194, Feb. 1998.

Huang, Q. et al., "The Impact of Scaling Down to Deep Submicron on CMOS RF Circuits," IEEE J. of Solid-State Circuits, vol. 33, No. 7, pp. 1023-1036, Jul. 1998.

Razavi, B., "RF Microelectronics," Prentice Hall, pp. 37-48, 1998.

Lee, T.H., "The Design of CMOS Radio Frequency Integrated Circuits," Cambridge, pp. 77-86, 1998.

Allstot, D.J., "Short Course: Low Noise Amplifiers," IEEE International Solid State Circuit Conference, 2001.

(Continued)

*Primary Examiner*—Khanh V Nguyen
(74) *Attorney, Agent, or Firm*—Blakely Sokoloff Taylor & Zafman LLP (57) ABSTRACT

Embodiments of the present invention include a common-gate amplifier having an input terminal and an output terminal, a transistor having a source, a drain, and a gate, four inductors, and two capacitors, and a negative amplification circuitry. The negative amplification circuitry has an input terminal to receive an RF signal. The negative amplification circuitry applies negative or zero amplification to the RF signal and outputs the negative or zero amplified signal on an output terminal. Alternative embodiments include a Colpitts differential oscillator, which includes two Colpitts single-ended oscillators. Each Colpitts single-ended oscillator includes a transistor. The source of the transistor in one Colpitts single-ended oscillator may be capacitively coupled to the gate of the transistor in the other Colpitts single-ended oscillator.

7 Claims, 10 Drawing Sheets

OTHER PUBLICATIONS

Cheng, Y. et al., "High-Frequency Small Signal AC and Noise Modeling of MOSFETs for RF IC Design," IEEE Transactions on Electron Devices, vol. 49, No. 3, pp. 400-408, Mar. 2002.

Andreani, P. et al., "Analysis and Design of a 1.8-GHz CMOS LC Quadrature VCO," IEEE J. of Solid-State Circuits, vol. 37, No. 12, pp. 1737-1747, Dec. 2002.

Ismail, A. et al., "CMOS Differential LC Oscillator with Suppressed Up-Converted Flicker Noise," 2003 IEEE International Solid-State Circuits Conference, pp. 98-99.

Li, X. et al., "Gm-Boosted Common-Gate LNA and Differential Colpitts VCO/QVCO in 0.18-µm CMOS," IEEE J. of Solid-State Circuits, vol. 40, No. 12, pp. 2609-2619, Dec. 2005.

* cited by examiner

RECEIVER WITH COLPITTS DIFFERENTIAL OSCILLATOR, COLPITTS QUADRATURE OSCILLATOR, AND COMMON-GATE LOW NOISE AMPLIFIER

GOVERNMENT LICENSE RIGHTS

The U.S. Government has a paid-up license in this invention and the right in limited circumstances to require the patent owner to license others on reasonable terms as provided for by the terms of Grant No CCR-0086032 and Grant No. CCR-0120255, both awarded by the National Science Foundation.

BACKGROUND

1. Field

Embodiments of the present invention are related to communication receivers and, in particular, to receivers that include voltage-controlled oscillators (VCO) and low-noise amplifiers (LNA).

2. Discussion of Related Art

Wireless communication systems commonly include cellular phones, radios, and radar systems, for example. A typical wireless system includes a receiver that receives a signal carried on an electromagnetic wave, such as a radio frequency (RF) signal.

The ever-increasing interest in wireless communication systems also is emphasizing higher levels of integration, more complex functionalities and lower cost in integrated circuit (IC) implementations. Recently, complementary metal oxide semiconductor (CMOS) has emerged as viable alternative for RF and microwave integrated circuit (MIC) designs owing to the continued scaling of minimum feature size. The ability to integrate complex digital signal processing functions makes CMOS an attractive candidate for system-on-chip (SOC) solutions. System-on-chip necessitates the implementation of different analog building blocks on the same die together with the large-scale digital circuits required by the complex digital signal processing (DSP) functions. Unfortunately, parasitic coupling in silicon technology, especially through the conductive silicon substrate, makes it possible for digital switching noise to corrupt the weak analog and RF signals.

Figure 1:
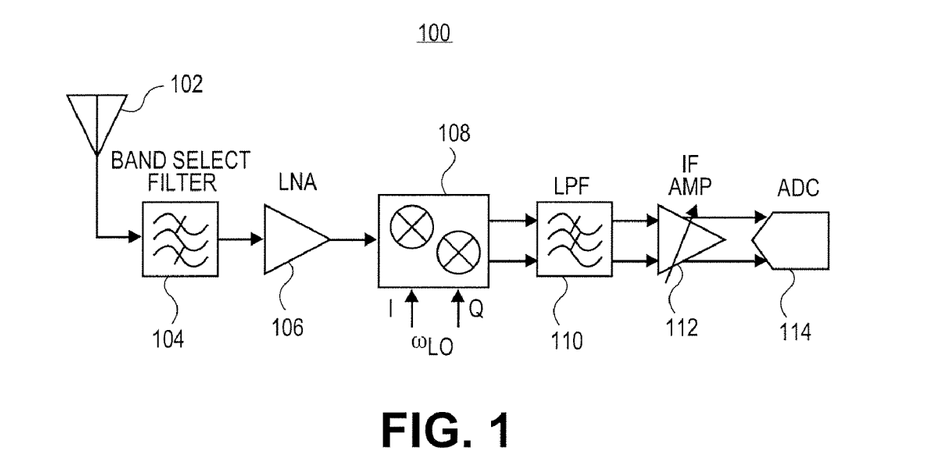
FIG. 1 is a simplified schematic diagram of a wireless receiver.

FIG. 1 is a simplified schematic diagram of a wireless receiver 100. The receiver 100 includes an antenna 102 coupled to a bandpass filter 104. The bandpass filter 104 is coupled to a low-noise amplifier (LNA) 106, which is coupled to a mixer 108. The mixer 108 is coupled to a low-pass filter (LPF) 110, which is coupled to an intermediate frequency (IF) amplifier 112. The IF amplifier 112 is coupled to an analog-to-digital converter (ADC) 114.

The receiver 100 may operate as follows. An RF signal may be transmitted to the receiver 100 and may arrive at the antenna 102. The bandpass filter 104 may filter out all frequencies in the RF signal that do not fall within its pass band. The LNA 106 may amplify the filtered signal and suppresses noise contributed by the filter 104. The mixer 108 may down-convert the filtered and amplified signals to a lower intermediate frequency (IF). The low pass filter (LPF) 110 may low-pass the output signal from the mixer 108. The IF amplifier 112 may amplify the signal from the LPF 110. The ADC 114 may convert the output of the IF amplifier 112 to a digital base band signal, such as to an audio frequency, for example.

A role that the LNA 106 plays in the receiver 100 is appreciated by considering the Friis equation, which states that noise from blocks following the LNA 106, typically the mixer 108, is suppressed by the gain of the LNA [1] [2] [3]. Therefore, low noise and high gain are the most important figures of merit of an LNA. In addition, LNA design involves tradeoffs between linearity, stability, input matching, and power consumption.

Two popular topologies are widely used to implement a LNA such as the LNA 106, namely, the common-gate configuration and common-source configuration. Common-gate topology has such advantages as lower power consumption, easier input matching, less sensitivity to parasitic capacitances, and better reverse isolation compared to those of common-gate topology. However, the higher noise figure and lower gain of the common-gate configuration impede it from being widely used. Instead, a common-source amplifier with inductive degeneration is a more popular choice in designing LNA circuits.

Figure 2:
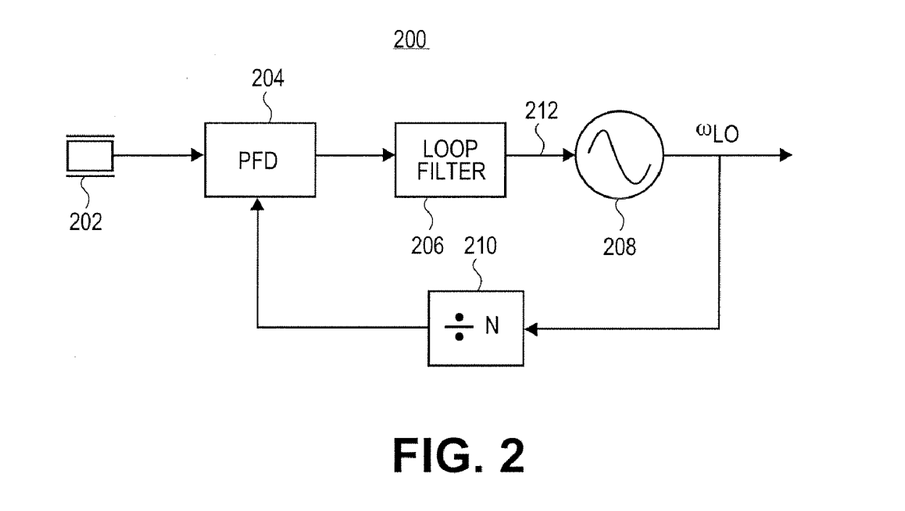
FIG. 2 is a simplified block diagram of a phase-locked loop (PLL)

Phase-locked loops (PLL) are widely used in many applications, including radio frequency synthesis, clock generation and clock and data recovery (CDR) circuits. Shown in FIG. 2 is a typical block diagram of a PLL 200 in which the output $\omega_{LO}$ of the PLL 200 can be used as an input to the mixer 108. The illustrated PLL 200 includes a reference frequency source 202 coupled to a phase-frequency detector (PFD) 204, whose output is coupled to a loop filter 206. The loop filter 206 is coupled to a voltage-controlled oscillator (VCO) 208, which is coupled to a divide-by-N circuit 210. The output of the divide-by-N circuit 210 is coupled to a second input of the PFD 204.

In operation, the PFD 204 detects the phase and/or frequency difference between the reference frequency supplied by the reference frequency source 202 and the output of divide-by-N circuit 210 and generates a DC voltage proportional to the difference. The loop filter 206 attenuates high frequency components and extracts the DC information from the PFD 204 output signal. The VCO 208 generates an oscillating waveform at the desired frequency according to the voltage 212 output from the loop filter 206.

In a PLL, all the constituent circuit blocks such as the VCO, frequency divider, loop filter, charge pump, and PFD contribute phase noise at the output. Typically, it is often the case that the VCO is the dominant source of phase noise. Therefore, extensive effort has been invested in improving the phase noise performance of oscillators.

BRIEF DESCRIPTION OF THE DRAWINGS

In the drawings, like reference numbers generally indicate identical, functionally similar, and/or structurally equivalent elements. The drawing in which an element first appears may be indicated by the leftmost digit(s) in the reference number, in which.

DETAILED DESCRIPTION OF THE ILLUSTRATED EMBODIMENTS

In a conventional common-gate LNA, noise factor is given by $$F = 1 + \frac{\overline{i_{nd}^2} \cdot \left(\frac{1}{1+g_m R_S}\right)^2}{\overline{i_{nS}^2} \cdot \left(\frac{g_m R_S}{1+g_m R_S}\right)^2} \quad (1)$$

$$= 1 + \frac{\overline{i_{nd}^2}}{\overline{i_{nS}^2}}\left(\frac{1}{g_m R_S}\right)^2$$

With $\overline{i_{nd}^2}=4kT\gamma g_{d0}\Delta f$, $\overline{i_{nS}^2}=4kTR_S^{-1}\Delta f$ and $\alpha=g_m/g_{d0}$, (1) reduces to $$F = 1 + \frac{4kT\gamma g_{d0}\Delta f}{4kTR_S^{-1}\Delta f}\left(\frac{1}{g_m R_S}\right)^2 \quad (2)$$

$$= 1 + \frac{\gamma g_{d0}}{g_m^2 R_S} = 1 + \frac{\gamma}{\alpha}\Big|_{g_m R_S=1}$$

where $\alpha$ and $\gamma$ are empirical process- and bias-dependent parameters, $g_m$ is the effective small signal transconductance, $R_S$ is the input impedance, F is the noise factor, $g_{d0}$ is the drain-source conductance at zero drain-source voltage, k is Boltzmann's constant, T is the absolute temperature in Kelvins, $i_{nS}$ is the noise current from source impedance, and $i_{nd}$ is the channel noise of MOSFET. Embodiments of the present invention are based on the following observation, that is, in order to lower noise figure F, $\alpha$ in (2) should be effectively increased. This goal is met by increasing the effective small signal transconductance $g_m$ while keeping $g_{d0}$ unchanged, as proposed in the current invention.

Figure 3:
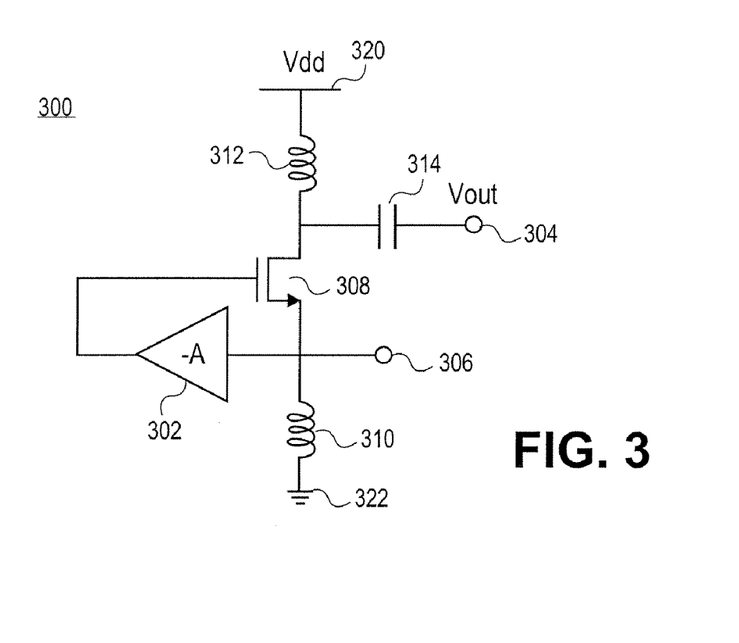
FIG. 3 is a schematic diagram of a general structure of a common-gate amplifier according to an embodiment of the present invention.

FIG. 3 is a schematic diagram of the general structure of a common-gate amplifier 300 according to an embodiment of the present invention. In the illustrated embodiment, the common-gate amplifier 300 includes an input node 306 and an output node Vout 304, a transistor 308, inductor 312, inductor 310, a capacitor 314, and negative amplification circuitry 302. The input of the negative amplification circuitry 302 is coupled to the source of the transistor 308 and the input node 306. The output of the negative amplification circuitry 302 is coupled to the gate of the transistor 308. The drain of the transistor 308 is coupled to one terminal of the inductor 312. The other terminal of the inductor 312 is coupled to a power supply Vdd 320. The capacitor 314 is coupled between the drain of the transistor 308 and output node 304. The inductor 312 and the capacitor 314 form a matching network, to match to 50Ω, for example. The inductor 310 is coupled between the source of the transistor 308 and ground 322. The inductor 310 provides high impedance at the operating frequency of the common-gate amplifier 300.

In operation, an input voltage Vin is injected into the source of the transistor 308. The voltage swing across gate-source capacitance of the transistor 308 generates a small signal current flowing to the load impedance (i.e., the inductor 312, the capacitor 314, and the impedance looking into drain of the transistor 308). The inductor 312 and the capacitor 314 form the matching network which transforms the impedance looking into drain of the transistor 308 to 50 Ω for maximum power match.

In the illustrated embodiment, instead of shorting the gate terminal of the transistor 308 to AC ground, the negative amplification circuitry 306 introduces a negative amplification between the source of the transistor 308 and the gate of the transistor 308. The effective transconductance looking into the source terminal is changed from $G_m=g_m$, as in the conventional CGLNA, to $G_m=(1+A)g_m$, where A is the gain from source to gate. The resulting noise factor may be calculated to be $$F = 1 + \frac{4kT\gamma g_{d0}\Delta f}{4kTR_S^{-1}\Delta f}\left(\frac{1}{(1+A)g_m R_S}\right)^2 \quad (3)$$

$$= 1 + \frac{\gamma g_{d0}}{(1+A)^2 g_m^2 R_S}$$

$$= 1 + \frac{\gamma}{\alpha(1+A)}\Big|_{(1+A)g_m R_S=1}$$

Comparing the noise factor for the conventional common-gate amplifier (shown in (2)) with respect to embodiments of the present invention (shown in (3)), it can be clearly seen that noise factor (F) is lowered.

In addition to a noise performance improvement, the common-gate low noise amplifier implemented according to embodiments of the present invention may consume less power as compared to conventional CGLNA. More specifically, since $(1+A)g_{m,new}=1/R_S$, $g_{m,new}$ is lowered to $1/(1+A)$ $g_m$ and the DC power is lowered by the same amount.

Figure 4:
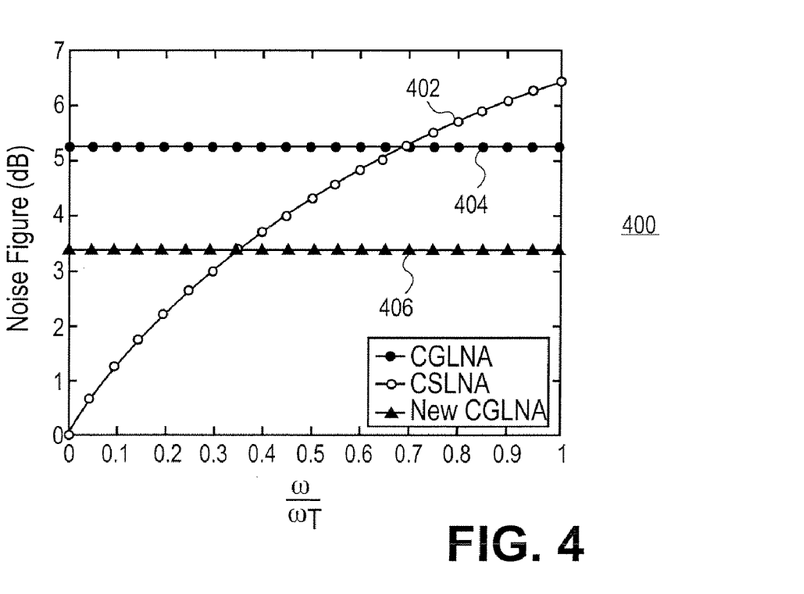
FIG. 4 is a graphical representation illustrating the comparison of noise figures between a conventional common-source low noise amplifier (CSLNA), a conventional common-gate low noise amplifier (CGLNA), and a common-gate low noise amplifier (CGLNA) implemented according to an embodiment of the present invention.

FIG. 4 is a graphical representation 400 illustrating the comparison of noise figures between a conventional CSLNA (curve 402), a conventional CGLNA (curve 404), and a common-gate low noise amplifier implemented according to embodiments of the present invention (e.g., the common-gate amplifier 300) (curve 406). It can be seen that the common-gate low noise amplifier implemented according to embodiments of the present invention outperforms the conventional CSLNA when $\omega/\omega_T$ is higher than 0.35.

Figure 5:
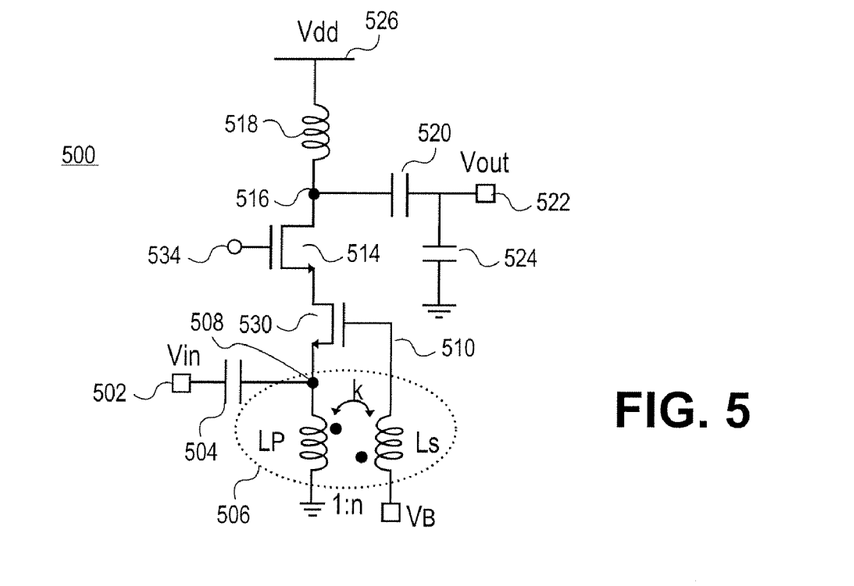
FIG. 5 is a schematic diagram of a general structure of a single-ended implementation of a common-gate amplifier according to an embodiment of the present invention.

FIG. 5 is a schematic diagram of a single-ended common-gate amplifier 500 according to an embodiment. In the illustrated embodiment, the common-gate amplifier 500 includes an input node Vin 502 and an output node Vout 522, a transistor 530, a transistor 532, an inductor 518, a transformer 506 with a primary inductor Lp and a secondary inductor Ls, a capacitor 520, a capacitor 524 and a capacitor 504. The input node 502 is coupled to the transistor 530's source 508 through the coupling capacitor 504. The transformer 506 couples the transistor 530's source 508 and the transistor 530's gate 510 together. The transistor 530's drain 514 is coupled to the transistor 532's source. The transistor 532's drain 516 is coupled to one terminal of the inductor 518. The other terminal of the inductor 518 is coupled to Vdd 526. The capacitor 520 is coupled between the transistor 532's drain 516 and the output node Vout 522. The capacitor 524 is coupled between output node Vout 522 and ground 528.

The transistor 530 acts as the input transistor of common-gate topology and is the main noise contributor. A DC bias voltage 512 provides AC ground for the transformer 506's secondary inductor Ls and also the bias for the transistor 530's gate 510. The transistor 532's gate is coupled to a second bias voltage 534.

In operation, the input voltage Vin is AC coupled through the coupling capacitor 504 to the source of the transistor 530, which acts as the input transistor of common-gate topology. The transformer 506 implements the negative amplification circuitry 302 in the general structure of the common-gate amplifier 300 (shown in FIG. 3) according to an embodiment of the present invention. The voltage swing across the gate-source capacitance of the transistor 530 generates a small signal current flowing to the source of the transistor 532. The transistor 532 acts as cascode transistor to suppress the Miller effect of the gate-drain capacitance of the transistor 530 and improves the reverse isolation and stability. The small signal coming out of the drain of the transistor 532 flows to the load impedance (i.e., the inductor 518, the capacitor 520, the capacitor 522, and the impedance looking into drain of the transistor 532). The inductor 518, the capacitor C1 520, and the capacitor 522 form the matching network which transforms the impedance looking into drain of M2 532 to 50Ω for maximum power match.

As shown in FIG. 5, the use of an on-chip transformer 506 to implement coupling of the source and gate terminals of the transistor 530 ensures the anti-phase operation between the source and the gate terminals. The inverse gain A=kn=k$\sqrt{L_S/L_P}$ is determined by the turn ratio n and the coupling factor k. It can be shown that the small-signal input admittance at the source of the transistor 530 is $$Y_{in} \approx \frac{1}{sL_P} + (1+nk)g_m + (1+2nk+n^2)sC_{gs} \quad (4)$$

The above expressions clearly show that the transformer coupling effectively increases the transconductance and therefore enables a reduction in power consumption. The noise factor is reduced to $1+\gamma/(1+A)\alpha$ under the new input matching condition of $(1+A)g_m R_S = 1$.

Figure 6:
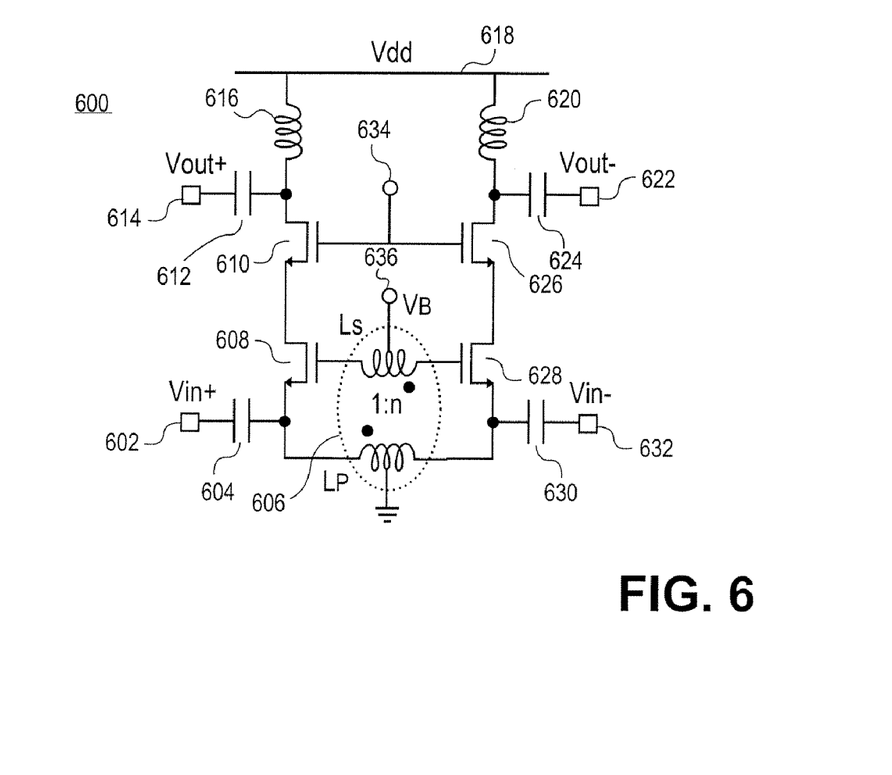
FIG. 6 is a schematic diagram of a general structure of a fully-differential implementation of a common-gate amplifier according to an embodiment of the present invention.

FIG. 6 is a schematic diagram of a fully-differential common-gate amplifier 600 according to an embodiment. It is the fully-differential counterpart of single-ended common-gate amplifier 500. In the illustrated embodiment, the amplifier 600 includes a positive input node Vin+ 602 coupled to a first terminal of a capacitor 604. The second terminal of the capacitor 604 is coupled to a transformer 606 comprising a primary inductor Lp and a secondary inductor Ls. A second terminal of the capacitor 604 is coupled to the source of a transistor 608, whose drain is coupled to the source of a transistor 610. The drain of the transistor 610 is coupled to one terminal of a capacitor 612, whose other terminal is coupled to a positive output node Vin+ 614. The other terminal of the capacitor 612 is coupled to one terminal of an inductor 616. The second terminal of the inductor 616 is coupled to Vdd 618, which is also coupled to one terminal of an inductor 620. The other terminal of the inductor 620 is coupled to a negative output node Vin− 622 via a capacitor 624. The other end of the inductor 620 also is coupled to the drain of a transistor 626. The source of the transistor 626 is coupled to the drain of a transistor 628, whose source is coupled to a negative input node Vin− 632 via a capacitor 630. A DC bias voltage 636 provides AC ground for the transformer 606's secondary inductor Ls and also the bias for the gates of the transistors 608 and 628. The gates of the transistor 610 and 626 are coupled to a second bias voltage 634.

Figure 7:
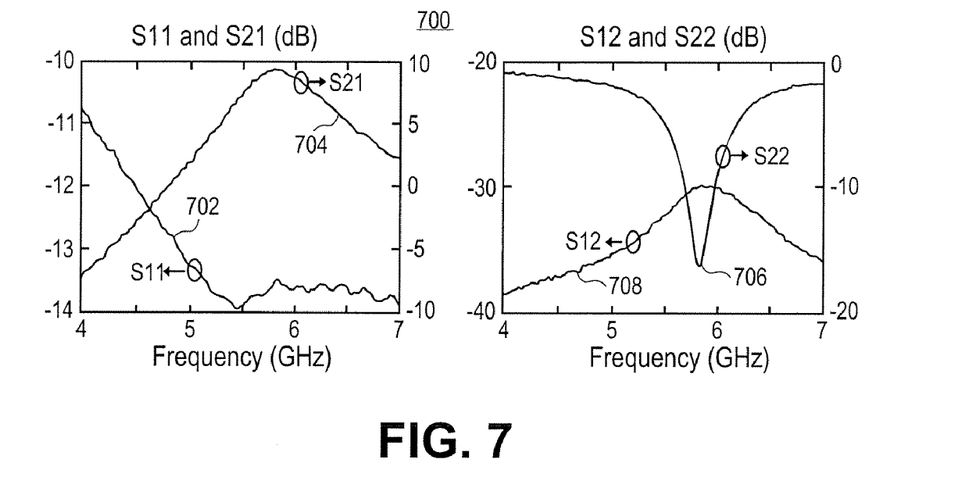
FIG. 7 is a graphical representation of measured and plotted S parameters of the common-gate low noise amplifier (CGLNA) depicted in FIG. 3 and/or FIG. 5 according to an embodiment of the present invention.

FIG. 7 is a graphical representation of measured and plotted S parameters for a common-gate amplifier implemented according to embodiments of the present invention. The measured S-parameters are close to simulated results in Spectre. Thanks to the wideband input matching of the common-gate configuration, S11 represented by curve 702 remains less than −10 dB over the frequency range from 4 GHz to 7 GHz, which demonstrates that a common-gate amplifier implemented according to embodiments of the present invention can tolerate process, voltage, and temperature variations as well as modeling errors. Compared to a common-source amplifier, a common-gate amplifier implemented according to embodiments of the present invention may be more robust for input matching. S21 represented by curve 704 shows peak of 9.8 dB at 5.8 GHz. S22 represented by curve 706 is below −10 dB around 5.8 GHz. S12 represented by curve 708 is below −30 dB from 4 GHz to 7 GHz.

Figure 8:
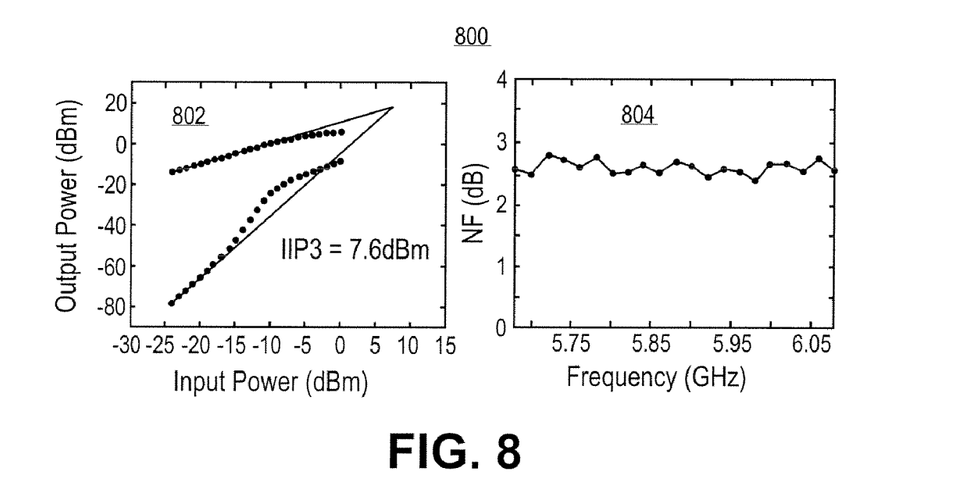
FIG. 8 is a graphical representation of measured and plotted third order input referred intercept point (IIP3) and noise figure (NF) of the common-gate low noise amplifier (CGLNA) depicted in FIG. 3 and/or FIG. 5 according to an embodiment of the present invention.

FIG. 8 is a graphical representation of measured and plotted IIP3 curve 802 and noise figure curve 804 for a common-gate amplifier implemented according to embodiments of the present invention. The measured IIP3 is 7.6 dBm and noise figure is 2.5 dB at 5.8 GHz.

One common-gate amplifier implemented according to embodiments of the present invention consumes 1.9 mA from 1.8V. The measured IIP3 is 7.6 dBm and the noise figure at maximum gain is 2.5 dB. Note that the current consumption may be very low owing to the $g_m$-boosted effect. Note also that the common-gate amplifier implemented according to embodiments of the present invention also achieves very good linearity. A common-source configuration may achieve similar or a better noise figure, but at the cost of a much higher power dissipation. Table 1 below summarizes the measured performance of the common-gate amplifier 500 according to an embodiment of the present invention

TABLE 1

Measured Performance Summary for the common-gate amplifier 400

| Technology | 0.18 μm CMOS |
|---|---|
| Power Supply | 1.8 V |

TABLE 1-continued

Measured Performance Summary for the common-gate amplifier 400

| | | |
|---|---|---|
| DC Current | | 1.9 mA |
| Operating Frequency | | 5.8 GHz |
| Noise Figure | | 2.5 dB |
| IIP3 | | 7.6 dBm |
| S-Parameters | S11 | −13.5 dB |
| | S21 | +9.4 dB |
| | S12 | −30.3 dB |
| | S22 | −14.8 dB |
| Die Area | | 910 μm × 670 μm |

Embodiments of the present invention also include Colpitts oscillators that may have improved start-up and phase noise. From the phase noise's point of view, Colpitts topology exhibits superior phase noise characteristic to that of cross-coupled topology. However, Colpitts oscillator requires more DC power consumption for reliable start-up and has less tuning range than cross-coupled oscillator. To relax the start-up issue in Colpitts oscillator, the gm-boosting technique implemented in the embodiments of the present invention of gm-boosting common-gate amplifier can be applied to Colpitts topology as well. As a result of gm-boosting, the effective small-signal negative transconductance may be increased and the start-up condition may be relaxed.

Figure 9:
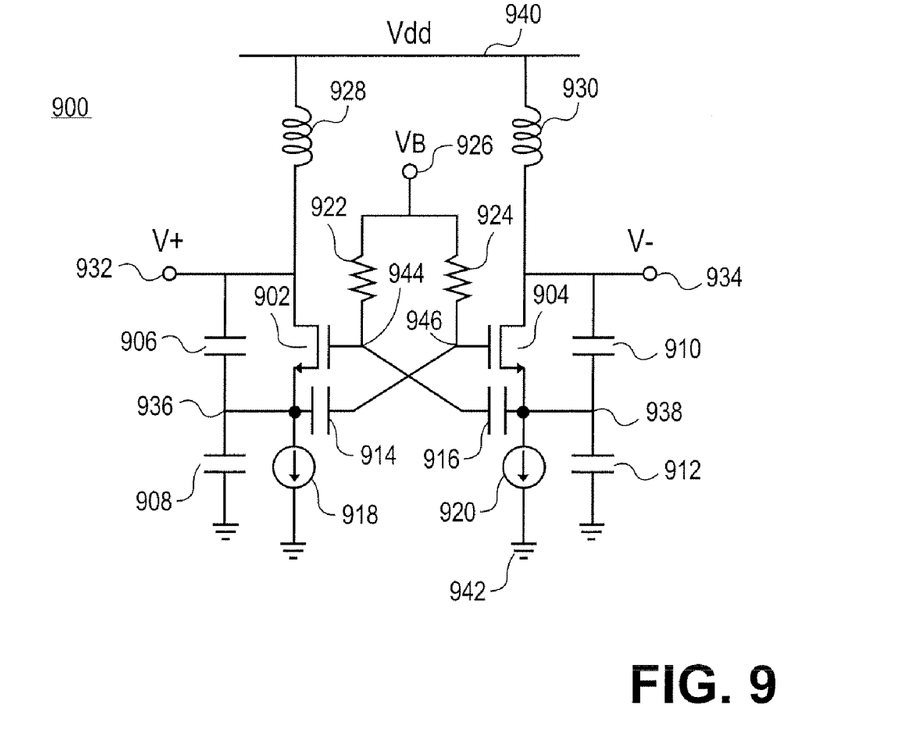
FIG. 9 is a schematic diagram of a Colpitts differential oscillator according to an embodiment of the present invention.

FIG. 9 is a schematic diagram of a Colpitts differential oscillator 900 according to an embodiment of the present invention. In the illustrated embodiment, the oscillator 900 includes a transistor 902, a transistor 904, a capacitor 906, a capacitor 910, a capacitor 908, a capacitor 912, a capacitor 914, a capacitor 916, a current source 918, a second current source 920, a bias resistor 922, a bias resistor 924, a bias voltage $V_B$ 926, an inductor 928, an inductor 930, a positive output node V+ 932 and a negative output node V− 934.

In the Colpitts differential oscillator 900, the current source 918 is coupled between the source of the transistor 902 and ground 942. The current source 920 is coupled between M2's source 938 and ground 942. The capacitor 914 is coupled between the source of the transistor 902 and the gate of the transistor 904. The capacitor 916 is coupled between the source of the transistor 902 and the gate of the transistor 904s. The capacitor 909 is coupled between the positive output node V+ 932 and the source of the transistor 902. The capacitor 910 is coupled between negative output node V− 934 and M2's source 938. The capacitor 908 is coupled between the source of the transistor 902 and ground 942. The capacitor 912 is coupled between the source of the transistor 904 and ground 942. The resistor 922 is coupled between the gate of the transistor 902 and the bias voltage $V_B$ 926. Resistor RB2 924 is coupled between M2's gate 946 and the bias voltage $V_B$ 926. The inductor 928 is coupled between the positive output node V+ 932 and the power supply Vdd 940. The inductor 930 is coupled between the negative output node V− 934 and the power supply Vdd 940.

In the Colpitts differential oscillator 900, the current source 918 provides the DC bias current for the transistor 902. The current source 920 provides the DC bias current for the transistor 904. The capacitors 906 and 908 provide the positive feedback from the drain of the transistor 902 to the source of the transistor 902. The capacitors 910 and 912 provide the positive feedback from the drain of the transistor 904 to the source of the transistor 904. The capacitor 914 couples the source of the transistor 902 to the gate of the transistor 904 and effectively double the small signal transconductance of transistor 902. The capacitor 916 couples the source of the transistor 904 to the gate of the transistor 902 and effectively doubles the small signal transconductance of the transistor 904. The resistor 922 provides the DC bias for the gate of the transistor 902. The resistor 924 provides the DC bias for the gate of the transistor 904. Due to the gm-boosting effect, the start-up condition of the Colpitts differential oscillator 900 may be relaxed to $$g_m R_P > \frac{(C_1 + C_2)^2}{C_1 C_2} \geq 2 \qquad (5)$$

Figure 10:
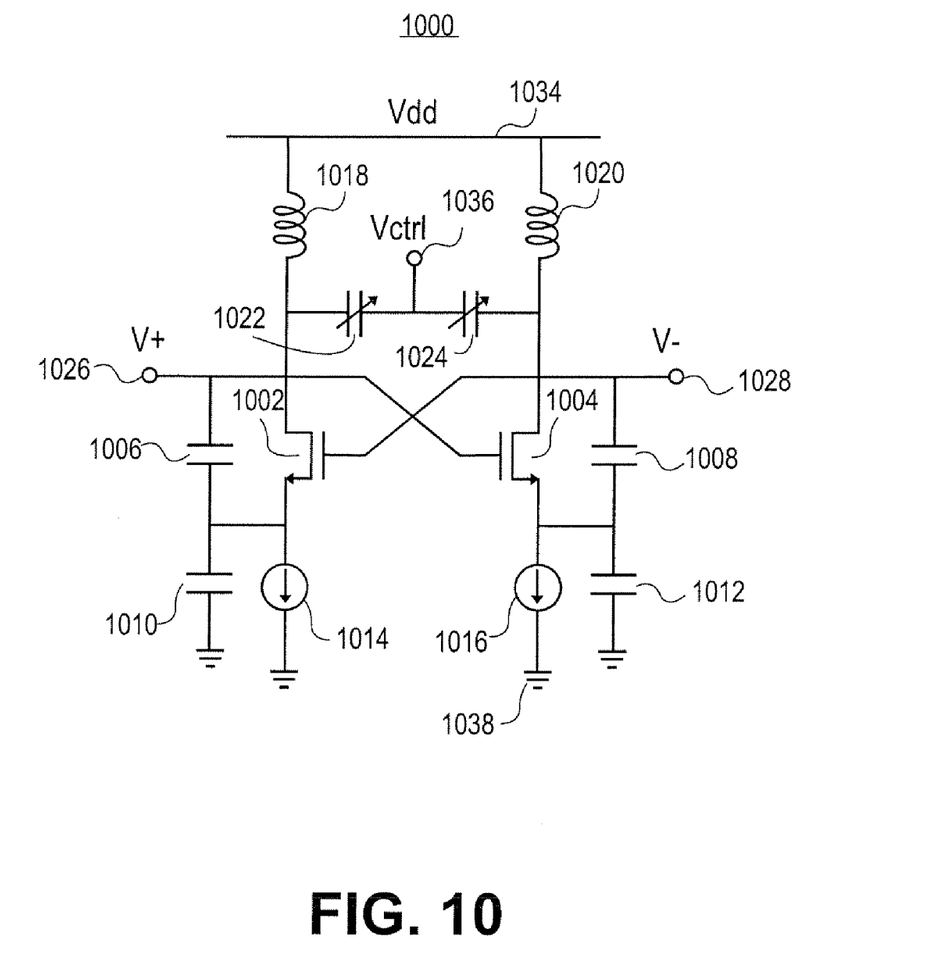
FIG. 10 is a schematic diagram of a Colpitts differential oscillator according to an alternative embodiment of the present invention.

FIG. 10 is a schematic diagram of a Colpitts differential oscillator 1000 according to an alternative embodiment of the present invention. In the illustrated embodiment, the oscillator 1000 includes a transistor 1002, a transistor 1004, a capacitor 1006, a capacitor 1008, a capacitor 1010, a capacitor 1012, a current source 1014, a second current source 1016, an inductor 1018, an inductor 1020, a varactor 1022, a second varactor 1024, a positive output node V+ 1026 and a negative output node V− 1028.

In the Colpitts differential oscillator 1000, the current source 1014 is coupled between the source of the transistor 1002 and ground 1038. The current source 1016 is coupled between the source of the transistor 1004 and ground 1038. The capacitor 1006 is coupled between the positive output node V+ 1026 and the source of the transistor 1002. The capacitor 1008 is coupled between the negative output node V− 1028 and the source of the transistor 1004. The capacitor 1010 is coupled between the source of the transistor 1002 and ground 1038. The capacitor 1012 is coupled between the source of the transistor 1004 and ground 1038.

The gate of the transistor 1002 is coupled to the negative output node V− 1028. The gate of the transistor 1004 is coupled to the positive output node V+ 1026. The drain of the transistor 1002 is coupled to the positive output node V+ 1026. The drain of the transistor 1004 is coupled to the negative output node V− 1028. The inductor 1018 is coupled between the positive output node V+ 1026 and the power supply Vdd 1034. The inductor 1020 is coupled between the negative output node V− 1028 and the power supply Vdd 1034. The varactor 1022 is coupled between the positive output node V+ 1026 and the control voltage Vcrtl 1036. The varactor 1024 is coupled between the negative output node V− 1028 and the control voltage Vcrtl 1036.

In the Colpitts differential oscillator 1000, the inductor 1018, the capacitor 1006, the capacitor 1010, and the varactor 1022 form the LC tank on the left side for oscillation. Similarly, the inductor 1020, the capacitor 1008, the capacitor 1012, and the varactor 1024 form the LC tank on the right side for oscillation. The varactors 1022 and 1024 are variable capacitors that implement the frequency tuning using the control voltage 1036. The capacitors 1006 and 1010 provide the positive feedback from the drain of the transistor 1002 to the source of the transistor 1002. The positive feedback is used to provide negative conductance to compensate the energy loss of the LC tank during oscillation cycle and sustain the oscillation. Similarly, the capacitors 1008 and 1012 provide the positive feedback from the drain of the transistor 1004 to the source of the transistor 1004.

The drains and gates of the transistors 1002 and 1004's are cross coupled. The cross-coupling between drains and gates of the transistors 1002 and 1004's help to boost the small signal transconductance of transistors 1002 and 1004 to higher value and therefore may result in more relaxed start-up condition. The current source 1014 provides the DC bias current for the transistor 1002. The current source 1016 provides the DC bias current for the transistor 1004. The positive output of the Colpitts differential oscillator 1000 is at the drain of the transistor 1026 and the negative output of the Colpitts differential oscillator 1000 is at the drain of the transistor 1028.

In the Colpitts differential oscillator 1000, the current source 1014 provides the DC bias current for the transistor 1002. The current source 1016 provides the DC bias current for the transistor 1004. The capacitors 1006 and 1010 provide the positive feedback from the drain of the transistor 1002 to the source of the transistor 1002. The capacitors 1008 and 1012 provide the positive feedback from the drain of the transistor 1004 to the source of the transistor 1004. It can be shown that the start-up condition of the Colpitts differential oscillator 1000 is relaxed to $$g_m R_P > \frac{2(C_1 + C_2)^2}{C_2(2C_1 + C_2)} \quad (6)$$

The direct cross-coupling between the drains and gates of the transistors 1002 and 1004 help to boost the small signal transconductance of the transistors 1002 and 1004 to higher value and therefore may result in more relaxed start-up condition, as implied by (5) and (6).

Figure 11:
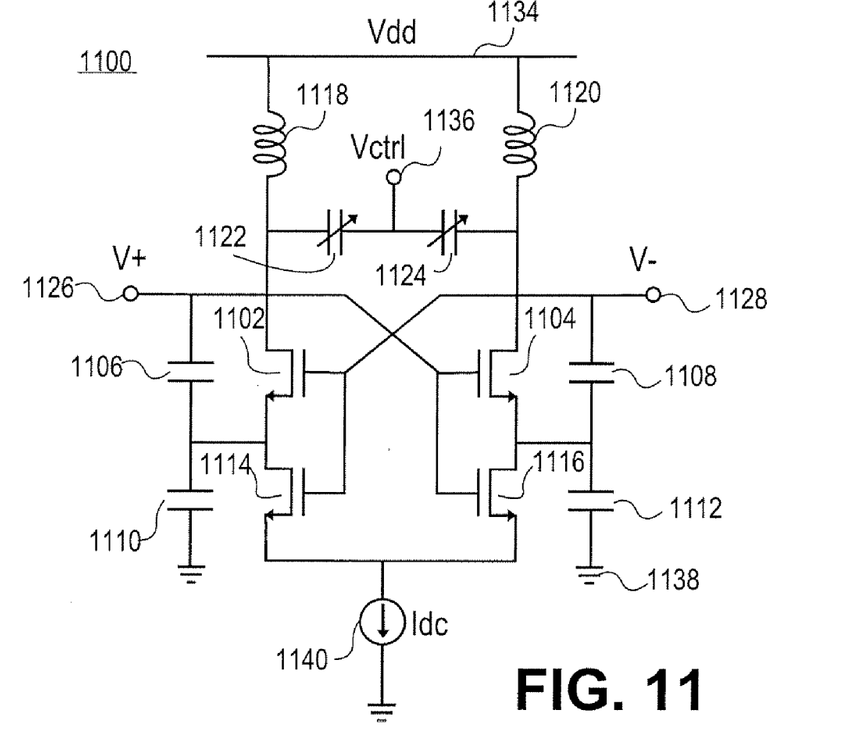
FIG. 11 is a schematic diagram of a Colpitts differential oscillator according to still another embodiment of the present invention.

FIG. 11 is a schematic diagram of a Colpitts differential oscillator 1100 according to an alternative embodiment of the present invention. In the illustrated embodiment, the oscillator 1100 includes a transistor 1102, a transistor 1104, a transistor 1114, a transistor 1116, a capacitor 1106, a capacitor 1108, a capacitor 1110, a capacitor 1112, a current source 1140, an inductor 1118, an inductor 1120, a varactor 1122, a varactor 1124, a positive output node V+ 1126 and a negative output node V− 1128.

In the Colpitts differential oscillator 1100, the current source 1140 is coupled between the common sources of the transistors 1114 and 1116 and ground 1138. The capacitor 1106 is coupled between the positive output node V+ 1126 and the source of the transistor 1102. The capacitor 1108 is coupled between the negative output node V− 1128 and the source of the transistor 1104. The capacitor 1110 is coupled between the source of the transistor 1102 and ground 1138. The capacitor 1112 is coupled between the source of the transistor 1104 and ground 1138.

The gate of the transistor 1102 is coupled to the negative output node V− 1128. Transistor M2's gate is coupled to the positive output node V+ 1126. The drain of the transistor 1102 is coupled to the positive output node V+ 1126. The drain of the transistor 1104 is coupled to the negative output node V− 1128. The drain of the transistor 1114 is coupled to the source of the transistor 1102. The drain of the transistor 1116 is coupled to the source of the transistor 1104. The sources of the transistors 1114 and 1116 are coupled together at one terminal of current source 1140. The gate of the transistor 1114 is coupled to the negative output node V− 1128. The gate of the transistor 1116 is coupled to the positive output node V+ 1126. The inductor 1118 is coupled between the positive output node V+ 1126 and the power supply Vdd 1134. The inductor 1120 is coupled between the negative output node V− 1128 and the power supply Vdd 1134. The varactor 1122 is coupled between the positive output node V+ 1126 and the control voltage Vcrtl 1136. The varactor 1124 is coupled between the negative output node V− 1128 and the control voltage Vcrtl 1136.

In the Colpitts differential oscillator 1100, the inductor 1118, the capacitor 1106, the capacitor 1110, and the varactor 1122 form the LC tank on the left side for oscillation. Similarly, the inductor 1120, the capacitor 1108, the capacitor 1112, and the varactor 1124 form the LC tank on the right side for oscillation. The varactors 1122 and 1124 are variable capacitors that implement the frequency tuning. The capacitors 1106 and 1110 provide the positive feedback from the drain of the transistor 1102 to the source of the transistor 1102. The positive feedback is used to provide negative conductance to compensate the energy loss of the LC tank during oscillation cycle and sustain the oscillation. Similarly, the capacitors 1108 and 1112 provide the positive feedback from the drain of the transistor 1104 to the source of the transistor 1104. The drains and gates of the transistors 1102 and 1104 are directly cross coupled.

The direct cross-coupling between the drains and gates of the transistors 1102 and 1104 help to boost the small signal transconductance of the transistors 1102 and 1104 to higher value and therefore may results in more relaxed start-up condition. The transistor 1114 is coupled between the current source 1140 and the transistor 1102. Similarly, the transistor 1116 is coupled between the current source 1140 and the transistor 1104. The current source 1140 provides the DC bias current for the transistors 1102, 1104, 1114 and 1116. The positive output is at the drain of the transistor 1126 and the negative output is at the drain of the transistor 1128.

In the Colpitts differential oscillator 1100, the current source 1140 provides the DC bias current for the transistors 1102 and 1104. The capacitors 1106 and 1110 provide the positive feedback from the drain of the transistor 1102 to the source of the transistor 1102. The capacitors 1108 and 1112 provide the positive feedback from the drain of the transistor 1104 to the source of the transistor 1104. The varactors 1122 and 1124 provide means of frequency tuning.

The main difference between Colpitts differential oscillator 1100 and Colpitts differential oscillator 1000 is that in the oscillator 1100, the transistors 1114 and 1116 are added to combine the current sources 1014 and 1016 into one current source 1140. Simulations in Cadence Spectre show that this arrangement improves the far-out phase noise performance of the Colpitts differential oscillator 1100 as compared to that of Colpitts differential oscillator 1000.

The embodiments implemented in FIG. 9, FIG. 10, and FIG. 11 provide the welcomed differential outputs V+ and V−. Also, the anti-phase relationship between the source and the gate of the cross-coupled transistors 902/904, 1002/1004, and 1102/1104 may result in sharper commutation and help to suppress the noise from differential pair [4]. Therefore, better phase noise may be achieved.

Generating quadrature signals may be often required in RF application, such as in the direct conversion receiver (DCR) 100 depicted in FIG. 1, for example. This be can be done through the use of a quadrature voltage-controlled oscillator (VCO), which is essentially a pair of oscillators coupled to each other so that the voltage-controlled oscillator outputs quadrature signals directly [5].

Figure 12:
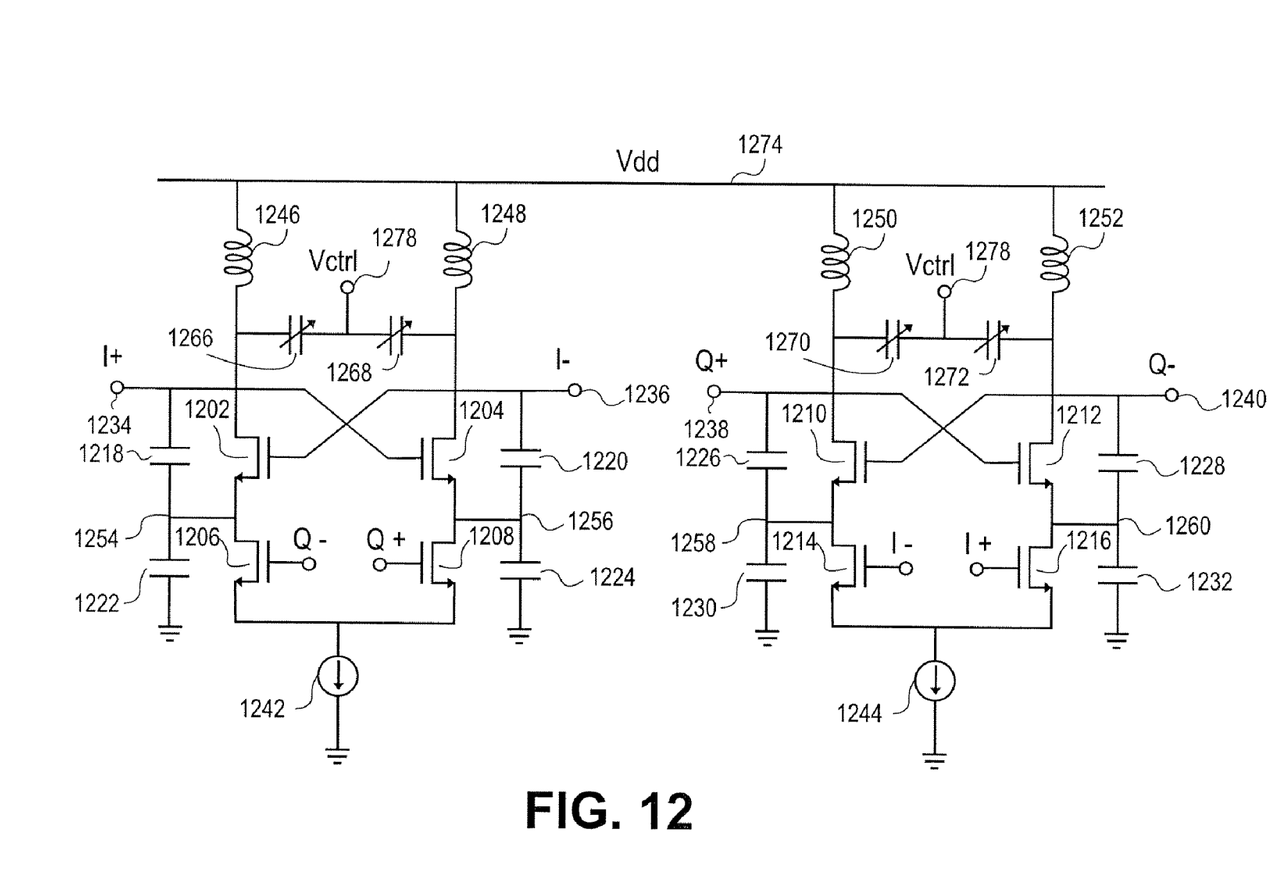
FIG. 12 is a schematic diagram of a Colpitts quadrature oscillator according to an embodiment of the present invention.

FIG. 12 is a schematic diagram of a Colpitts quadrature oscillator 1200 according to an embodiment of the present invention. The oscillator 1200 may be based on the Colpitts differential oscillator 1100. In the illustrated embodiment, the quadrature oscillator 1200 includes a transistor 1202, a transistor 1204, a transistor 1206, a transistor 1208, a transistor 1210, a transistor 1212, a transistor 1214, a transistor 1216, a capacitor 1218, a capacitor 1220, a capacitor 1222, a capacitor 1224, a capacitor 1226, a capacitor 1228, a capacitor 1230, a capacitor 1232, an in-phase positive output node I+ 1234, an in-phase negative output node I− 1236, a quadrature positive output node Q+ 1238, a quadrature negative output node Q−

1240, a current source 1242, a current source 1244, an inductor 1246, an inductor 1248, an inductor 1250, an inductor 1252, a varactor 1266, a varactor 1268, a varactor 1270, a varactor 1272.

In the Colpitts quadrature oscillator 1200, the current source 1242 is coupled between the common sources of the transistors 1206 and 1208 and ground 1276. The current source 1244 is coupled between the common sources of the transistors 1214 and 1216 and ground 1276. The capacitor 1218 is coupled between the in-phase positive output node I+ 1234 and the source of the transistor 1202. The capacitor 1220 is coupled between the in-phase negative output node I− 1236 and the source of the transistor 1204s. The capacitor 1222 is coupled between the source of the transistor 1202 and ground 1276. The capacitor 1224 is coupled between the source of the transistor 1204 and ground 1276. The capacitor 1226 is coupled between the quadrature positive output node Q+ 1238 and the source of the transistor 1210. The capacitor 1228 is coupled between the quadrature negative output node Q− 1240 and the source of the transistor 1212. The capacitor 1230 is coupled between the source of the transistor 1210 and ground 1276. The capacitor 1232 is coupled between the source of the transistor 1212 and ground 1276.

The gate of the transistor 1202 is coupled to the in-phase negative output node I− 1236. The gate of the transistor 1204 is coupled to the in-phase positive output node I+ 1234. The drain of the transistor 1202 is coupled to the in-phase positive output node I+ 1234. The drain of the transistor 1204 is coupled to the in-phase negative output node I− 1236. The drain of the transistor 1206 is coupled to the source of the transistor 1202. The drain of the transistor 1208 is coupled to the source of the transistor 1204. The sources of the transistors 1206 and 1208 are coupled together at one terminal of current source 1242. The gate of the transistor 1206 is coupled to the quadrature positive output node Q+ 1238. The gate of the transistor 1208 is coupled to the quadrature negative output node Q− 1240. The gate of the transistor 1210 is coupled to the quadrature negative output node Q− 1240. The gate of the transistor 1204 is coupled to the quadrature positive output node Q+ 1238. The drain of the transistor 1210 is coupled to the quadrature positive output node Q+ 1238. The drain of the transistor 1212 is coupled to the quadrature negative output node Q− 1240. The drain of the transistor 1214 is coupled to the source of the transistor 1210. The drain of the transistor 1218 is coupled to the source of the transistor 1212. The sources of the transistor 1214 and 1216 are coupled at one terminal of current source 1244. The gate of transistor 1214 is coupled to the in-phase negative output node I− 1236. The gate of the transistor 1216 is coupled to the in-phase positive output node I+ 1234.

The inductor 1246 is coupled between the in-phase positive output node I+ 1234 and the power supply 1274. The inductor 1248 is coupled between the in-phase negative output node I− 1236 and the power supply 1274. The inductor 1250 is coupled between the quadrature positive output node Q+ 1238 and the power supply 1274. The inductor 1252 is coupled between the quadrature negative output node Q− 1240 and the power supply 1274.

The varactor 1266 is coupled between the in-phase positive output node I+ 1234 and the control voltage Vcrtl 1278. The varactor 1268 is coupled between the in-phase negative output node I− 1236 and the control voltage Vcrtl 1278. The varactor 1270 is coupled between the quadrature positive output node Q+ 1238 and the control voltage Vcrtl 1278. The varactor 1272 is coupled between the quadrature negative output node Q− 1240 and the control voltage Vcrtl 1278.

In the Colpitts quadrature oscillator 1200, the inductor 1246, the capacitor 1218, the capacitor 1222, and the varactor 1266 form the LC tank on the left side for the I oscillator. The inductor 1248, the capacitor 1220, the capacitor 1224, and the varactor 1268 form the LC tank on the right side for the I oscillator. Similarly, the inductor 1250, the capacitor 1226, the capacitor 1230, and the varactor 1270 form the LC tank on the left side for the Q oscillator. The inductor 1252, the capacitor 1228, the capacitor 1232, and the varactor 1272 form the LC tank on the right side for the Q oscillator.

The varactors 1266, 1268, 1270, and 1272 are variable capacitors that implement the frequency tuning. The capacitors 1218 and 1222 provide the positive feedback from the drain of the transistor 1202 to the source of the transistor 1202. The positive feedback is used to provide negative conductance to compensate the energy loss of the LC tank during oscillation cycle and sustain the oscillation. Similarly, the capacitors 1220 and 1224 provide the positive feedback from the drain of the transistor 1204 to the source of the transistor 1204. The capacitors 1226 and 1230 provide the positive feedback from the drain of the transistor 1210 to the source of the transistor 1210. The capacitors 1228 and 1232 provide the positive feedback from the drain of the transistor 1212 to the source of the transistor 1212.

The drains and gates of the transistors 1202 and 1204 are cross coupled. The cross-coupling between drains and gates of the transistors 1202 and 1204 help to boost the small signal transconductance of the transistors 1202 and 1204 to higher value and therefore may result in more relaxed start-up condition. Similarly, the drains and gates of the transistors 1210 and 1212 are directly cross coupled. The transistor 1206 is coupled between the current source 1242 and the transistor 1202. The transistor 1208 is coupled between the current source 1242 and the transistor 1204.

The transistors 1206 and 1208 act as the coupling devices between I oscillator and Q oscillator. Similarly, the transistor 1214 is coupled between the current source 1244 and the transistor 1210. The transistor 1216 is coupled between the current source 1244 and the transistor 1212. Note that the couplings are in an inverse sense. The current source 1242 provides the DC bias current for the transistors 1202, 1204, 1206, and 1208. Similarly, the current source 1244 provides the DC bias current for the transistors 1210, 1212, 1214, and 1216. The positive output of the I oscillator is at the drain of the transistor 1202 and the negative output of the I oscillator is at the drain of the transistor 1204. Similarly, the positive output of Q oscillator is at the drain of the transistor 1210 and the negative output of Q oscillator is at the drain of the transistor 1212.

In the Colpitts quadrature oscillator 1200, the current source 1242 provides the DC bias current for the transistors 1202 and 1204. The current source 1244 provides the DC bias current for the transistors 1210 and 1212. The capacitors 1218 and 1222 provide the positive feedback from the drain of the transistor 1202 to the source of the transistor 1202. The capacitors 1220 and 1224 provide the positive feedback from the drain of the transistor 1204 to the source of the transistor 1204. The capacitors 1226 and 1230 provide the positive feedback from the drain of the transistor 1210 to the source of the transistor 1210. The capacitors 1228 and 1232 provide the positive feedback from the drain of the transistor 1212 to the source of the transistor 1204. The transistor 1206, 1208, 1214, and 1216 provide the coupling between the in-phase oscillator and the quadrature oscillator. Note that the coupling is in a inverse sense. The varactors 1266, CV2 1268, 1270, and 1272 provide means of frequency tuning.

Simulations in Spectre show that the proposed Colpitts differential oscillators 900/1000/1100 and Colpitts quadrature oscillator 1200 achieve excellent phase noise performance. Compared to the standard cross-coupled oscillator, an average of 2 dB improvement at 3 MHz offset and 6 dB improvement at close-in offset frequency are obtained.

Figure 13:
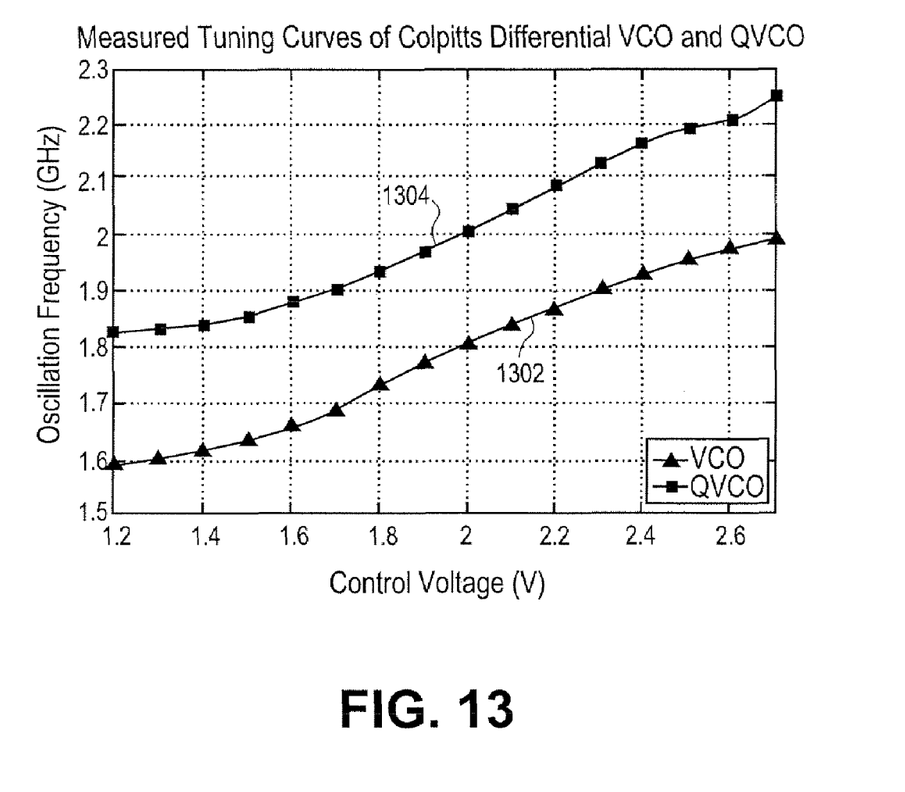
FIG. 13 is a graphical representation of measured and plotted tuning curves for the Colpitts differential oscillator depicted in FIG. 10 and Colpitts quadrature oscillator depicted in FIG. 12 according to an embodiment of the present invention.

To further evaluate the invention, Colpitts differential oscillator 1000 and Colpitts quadrature oscillator 1200 are fabricated in a standard 6-metal 0.18 μm CMOS RF process. FIG. 13 is a graphical representation 1300 illustrating a plot of the tuning curve 1302 for the Colpitts differential oscillator 1000 and the tuning curve 1304 for the Colpitts quadrature oscillator 1200 according to an embodiment of the present invention. In the illustrated embodiment, the Colpitts differential oscillator 1000 operates from 1.59 GHz to 1.98 GHz with a tuning range of 22%. The Colpitts quadrature oscillator 1100 operates from 1.83 GHz to 2.24 GHz corresponding to a 20% tuning range, which may be enough in reality considering the process, voltage and temperature (PVT) variations.

Figure 14:
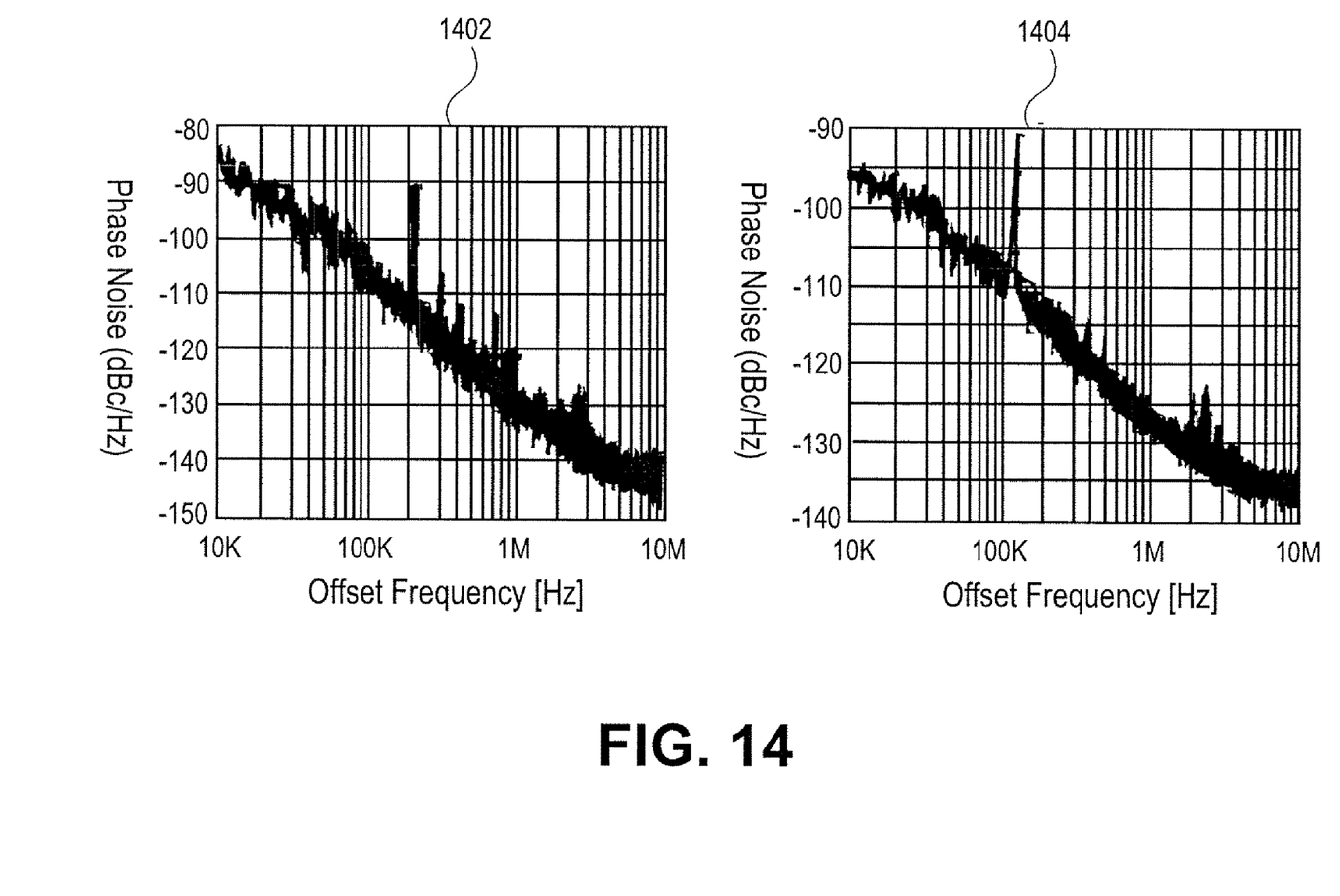
FIG. 14 is a graphical representation of measured and plotted phase noises for the Colpitts differential oscillator depicted in FIG. 10 and Colpitts quadrature oscillator depicted in FIG. 12 according to an embodiment of the present invention.

FIG. 14 is a graphical representation 1400 illustrating the measured phase noise curve 1402 of a Colpitts LC oscillator 1000 according to an embodiment of the present invention and the measured phase noise curve 1404 of the Colpitts quadrature oscillator 1200 according to an embodiment of the present invention.

Table 2 below summarizes the performance of the Colpitts differential oscillator 1000 according to an embodiment of the present invention. Table 3 below lists the performance of the Colpitts quadrature oscillator 1200 according to an embodiment of the present invention. The relatively small current consumption also validates the improvement of easier start-up.

TABLE 2

Measured Performance Summary for the Colpitts differential oscillator 1000

| Technology | | 0.18 μm CMOS | |
|---|---|---|---|
| Power Supply | | 2.0 V | |
| DC Current | | 3.6 mA | |
| Frequency | | 1.59 GHz~1.98 GHz | |
| Tuning Range | | 22% | |
| | Offset Frequency | Phase Noise | Figure of Merit (FOM) |
| Phase Noise | @ 10 KHz | −87.7 dBc/Hz | 183.2 dB |
| | @ 100 KHz | −105.8 dBc/Hz | 181.3 dB |
| | @ 600 KHz | −122.9 dBc/Hz | 182.8 dB |
| | @ 1 MHz | −128.0 dBc/Hz | 183.5 dB |
| Die Area | | 970 μm × 710 μm | |

TABLE 3

Measured Performance Summary for the Colpitts quadrature oscillator 1200

| Technology | | 0.18 μm CMOS | |
|---|---|---|---|
| Power Supply | | 2.0 V | |
| DC Current | | 4.3 mA | |
| Frequency | | 1.83 GHz~2.24 GHz | |
| Tuning Range | | 20% | |
| | Offset Frequency | Phase Noise | Figure of Merit (FOM) |
| Phase Noise | @ 10 KHz | −95.9 dBc/Hz | 191.8 dB |
| | @ 100 KHz | −106.3 dBc/Hz | 182.2 dB |
| | @ 600 KHz | −121.4 dBc/Hz | 181.7 dB |
| | @ 1 MHz | −127.0 dBc/Hz | 182.9 dB |
| Die Area | | 1450 μm × 940 μm | |

As described above, embodiments of the present invention may be implemented using hardware, software, or a combination thereof. In implementations using software, the software may be stored on a machine-accessible medium. A machine-accessible medium includes any mechanism that may be adapted to store and/or transmit information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), as recess as electrical, optical, acoustic, or other form of propagated signals (e.g., carrier waves, infrared signals, digital signals, etc.).

Reference throughout this specification to "one embodiment" or "an embodiment" means that a particular feature, structure, process, block, or characteristic described in connection with an embodiment may be included in at least one embodiment of the present invention. Thus, the appearance of the phrases "in one embodiment" or "in an embodiment" in various places throughout this be specification does not necessarily mean that the phrases all refer to the same embodiment. The particular features, structures, or characteristics may be combined in any suitable manner in one or more embodiments.

REFERENCES

[1] David J. Allstot, Short Course: Low Noise Amplifiers, *IEEE International Solid State Circuit Conference*, 2001.

[2] Razavi, R F Microelectronics, Prentice Hall, 1998.

[3] Thomas H. Lee, The Design of CMOS Radio Frequency Integrated Circuits, Cambridge, 1998.

[4] A. Hajimiri, et al., "A General Theory of Phase Noise in Electrical Oscillators," *IEEE J. Solid-State Circuits*, vol. 33, pp. 179-194, February 1998.

[5] A. Rofougaran, J. Rael, M. Rofougaran and A. A. Abidi, "A 900 MHz CMOS LC-oscillator with quadrature outputs," *IEEE International Solid-State Circuits Conference*, 1996, pp. 392-393.

What is claimed is:

1. An apparatus, comprising:
a first transistor having a source, a drain, and a gate;
a second transistor having a source, a drain, and a gate; and
a transformer having a primary and a secondary,
wherein the source of the first transistor is coupled to a first terminal of the primary and to an input terminal of the apparatus,
wherein the second terminal of the primary is coupled to a ground, wherein the gate of the first transistor is coupled to a first terminal of the secondary,
wherein the second terminal of the secondary is coupled to a bias voltage,
wherein the drain of the first transistor is coupled to the source of the second transistor,
wherein the gate of the second transistor is coupled to $V_{DD}$,
wherein the drain of the second transistor is coupled to a first terminal of an inductor and to a first terminal of a first capacitor,
wherein the second terminal of the inductor is coupled to $V_{DD}$, wherein the second terminal of the first capacitor is coupled to a first terminal of a second capacitor, and
wherein the second terminal of the second capacitor is coupled to the ground of the apparatus.

2. The apparatus of claim 1, further comprising a capacitor to couple a signal from the input terminal to the transformer.

3. The apparatus of claim 1, wherein the transformer is to introduce negative amplification in the apparatus.

4. An apparatus, comprising:

a differential common-gate amplifier having:

a first capacitor, a second capacitor, a third capacitor, and a fourth capacitor, each having a first terminal and a second terminal;

a first transistor, a second transistor, a third transistor, and a fourth transistor, each having a source, a drain, and a gate;

a transformer having a primary and a secondary, the primary and the secondary each having a first terminal and a second terminal;

a first inductor and a second inductor, each having a first terminal and a second terminal;

a positive input node;

a positive output node;

a negative input node; and a negative output node, wherein the positive input node is coupled to the first terminal of the first capacitor, wherein the second terminal of the first capacitor is coupled to the first terminal of the transformer primary and to the source of the first transistor, wherein the gate of the first transistor is coupled to the first terminal of the transformer secondary, wherein the second terminal of the transformer secondary is coupled to the gate of the third transistor, wherein the second terminal of the transformer primary is coupled to the source of the third transistor and to the first terminal of the third capacitor, wherein the second terminal of the third capacitor is coupled to the negative input node;

wherein the drains of the first and third transistors are coupled to the sources of the second and fourth transistors, respectively;

wherein the drains of the second and fourth transistors are coupled to the first terminals of the second and fourth capacitors, respectively;

wherein the second terminals of the second and fourth capacitors, are coupled to the positive output node and the negative output node, respectively, and to the first terminals of the first and second inductors, respectively, and wherein the second terminals of the first and second inductors are coupled to Vdd.

5. The apparatus of claim 4, further comprising an input node to receive a voltage to bias the first and/or the third transistors.

6. The apparatus of claim 5, wherein the input node is further to receive a voltage to provide AC ground for the transformer secondary.

7. The apparatus of claim 5, further comprising a second input node to receive a voltage to bias the second and/or the fourth transistors.

* * * * *